(12) United States Patent
Wu et al.

(10) Patent No.: US 7,151,296 B2
(45) Date of Patent: Dec. 19, 2006

(54) HIGH VOLTAGE LATERAL DIFFUSED MOSFET DEVICE

(75) Inventors: Kuo-Ming Wu, Hsinchu (TW); Chen-Bau Wu, Zhubei (TW); Jiann-Tyng Tzeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/980,080

(22) Filed: Nov. 3, 2004

(65) Prior Publication Data
US 2006/0091503 A1  May 4, 2006

(51) Int. Cl.
*H01L 29/76* (2006.01)
*H01L 29/94* (2006.01)

(52) U.S. Cl. ............... 257/328; 257/500; 257/E29.256
(58) Field of Classification Search ............... 257/328
See application file for complete search history.

(56) References Cited

U.S. PATENT DOCUMENTS

| | | | |
|---|---|---|---|
| 6,252,278 B1 | 6/2001 | Hsing | |
| 6,518,138 B1 | 2/2003 | Hsing | |
| 6,573,144 B1 | 6/2003 | Takahashi et al. | |
| 2002/0089001 A1* | 7/2002 | Lin | 257/288 |
| 2005/0170595 A1* | 8/2005 | Li et al. | 438/301 |
| 2006/0006461 A1* | 1/2006 | Chidambaram | 257/341 |

* cited by examiner

*Primary Examiner*—Tu-Tu Ho
(74) *Attorney, Agent, or Firm*—Haynes and Boone, LLP

(57) ABSTRACT

A semiconductor device comprises a substrate. A source active region and a drain active region are disposed in the substrate and spaced from one another in a first dimension. The source active region has a first and a second outline defining a width of the source active region in a second dimension substantially perpendicular to the first dimension. A gate has a third outline and a fourth outline defining a width of the gate not more than the width of the source active region. The gate is disposed between a source in the source active region and a drain in the drain active region and between the first and the second outline. The source has a width not more than the width of the gate. The source is disposed proximate the gate and between the third and the fourth outline.

27 Claims, 4 Drawing Sheets

HIGH VOLTAGE LATERAL DIFFUSED MOSFET DEVICE

BACKGROUND

As semiconductor circuits such as metal-oxide-semiconductor field effect transistors (MOSFETS) are adapted for high voltage applications, problems arise with respect to the current versus voltage response of the device.

In a MOSFET device, such as lateral diffused metal-oxide semiconductor (LDMOS) structures, when a high enough voltage is applied to the gate, a channel under shallow trench isolation (STI) in the non-active region may turn on the parasitic field device. As a result, a leakage current flows through the channel and causes the device's current versus voltage response to adversely deviate from the desired current-voltage relationship.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
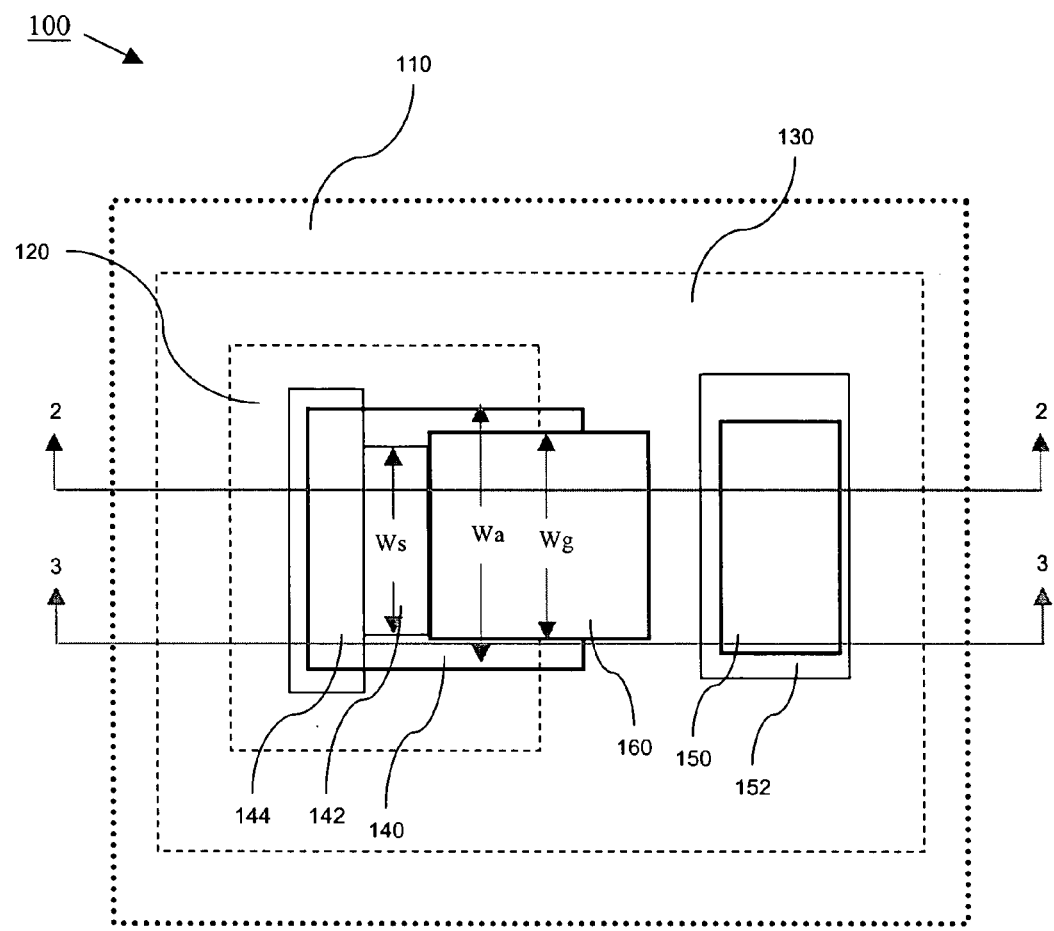
FIG. 1 is a plan view of one embodiment of a high voltage semiconductor device constructed according to aspects of the present disclosure.

The present disclosure relates generally to the field of semiconductor integrated circuits, more particularly, to high voltage integrated circuits.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
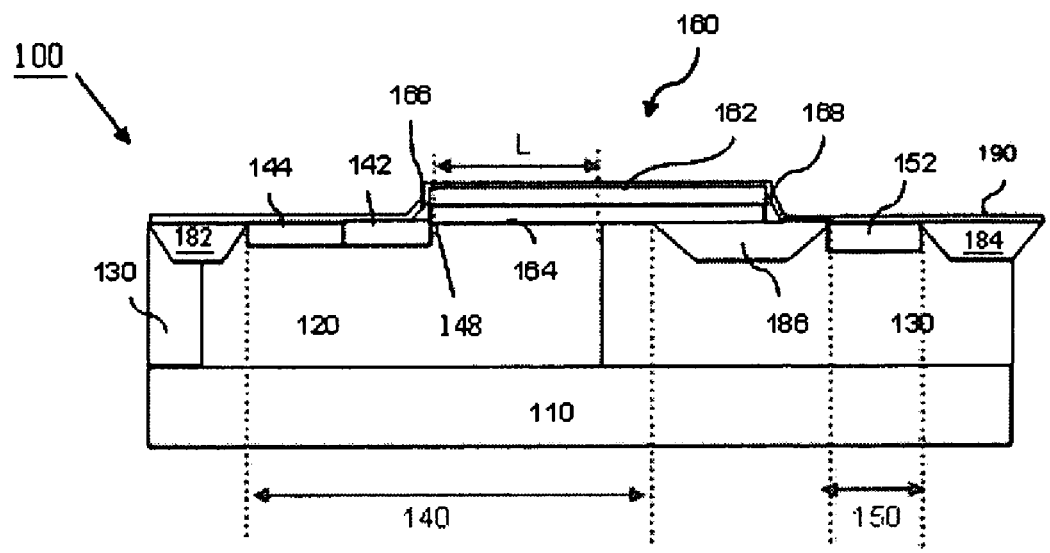
FIG. 2 is a cross-sectional view of the embodiment of the high voltage semiconductor device of FIG. 1 taken along line 2—2.
Figure 3:
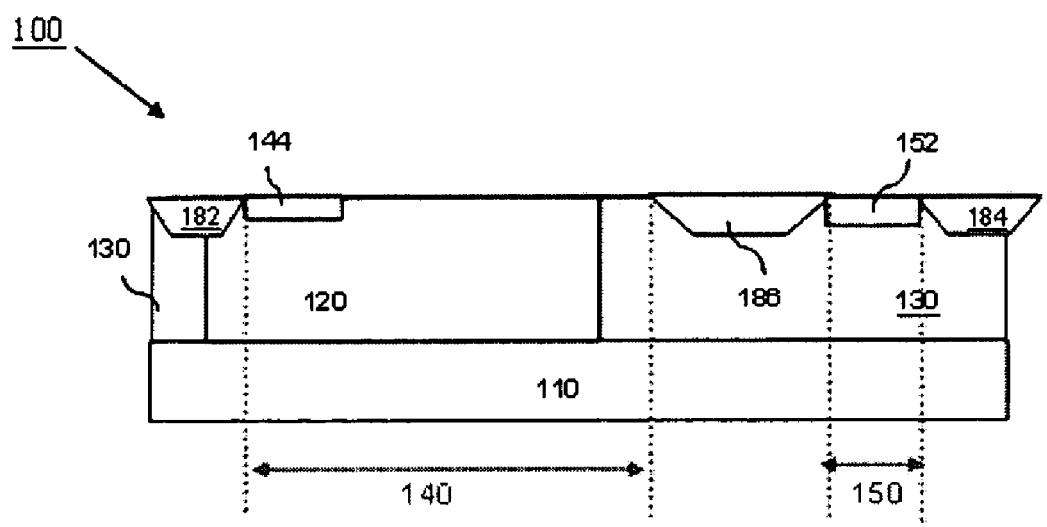
FIG. 3 is a cross-sectional view of the embodiment of the high voltage semiconductor device of FIG. 1 taken along line 3—3.

FIG. 1 is a plan view of one embodiment of a high voltage semiconductor device 100 having an asymmetric structure. The high voltage semiconductor device 100 includes a substrate 110. With additional references to FIG. 2 and FIG. 3 for cross-sectional views of the high voltage semiconductor device 100 of FIG. 1 taken along lines 2—2 and 3—3, respectively, the high voltage semiconductor device 100 having a new gate feature is more detailed described according to the present disclosure.

The substrate 110 may comprise a buried layer such as an N-type buried layer (NBL), a P-type buried layer (PBL), and a buried dielectric layer including a buried oxide (BOX) layer for example. For example, a P-type substrate may comprise an NBL at least under a P-type metal oxide semiconductor field effect transistor (PMOSFET). In another example, an N-type substrate may comprise a PBL at least under an N-type metal oxide semiconductor field effect transistor (NMOSFET). In another example, the substrate may comprise a BOX layer under both an NMOSFET and PMOSFET. Above buried layer may be formed by ion implantation such as the BOX may be formed using a method referred to as separation by implanted oxygen (SIMOX).

Located in the substrate 110 are a P-well region 120 (also referred to as high voltage P-well or HVPW) and an N-well region 130 (also referred to as high voltage N-well or HVNW) adjusted thereto. The N-well region 130 may be configured to laterally surround the P-well region 120. The P-well region 120 and the N-well region 130 may be part of substrate 110, and may be formed by ion implantation. Alternatively, the P-well region 120 and the N-well region 130 may be portion of an epitaxy layer such as a silicon epitaxy layer formed by epitaxy processing. The P-well region 120 has a P-type dopant such as boron, and the N-well region 130 has an N-type dopant such as phosphorus. In another embodiment, the well regions 120 and 130 may be formed, respectively, by a plurality of processing steps now known or to be developed such as growing a sacrificial oxide on substrate 110, opening a pattern for the location of the N-well region or P-well region, and implanting the impurities.

An isolation structure such as shallow trench isolation (STI) including 182, 184, and 186 may be formed within the substrate to electrically isolate to define an active region 140 and an active region 150. The active region 140 may include an N-doped region 142 that functions as a source. The active region 140 may further include a P-doped region 144 that functions as a body contact to the P-well region 120. The P-doped region may be extended beyond the active region 140 by a process such as diffusion during an annealing. An N-doped region 152 as a drain may be formed in the active region 150 and may extend beyond the active region 150. Around the active regions 140 and 150, the isolation features such as 182, 184, and 186 are formed.

The source 142 and drain 152 may be doped with an N-type impurity such as phosphorous for a N-channel metal-oxide-semiconductor (MOS) transistor (or a P-type impurity such as boron for a P-channel MOS transistor). The source 142 and drain 152 may be formed by ion implantation and/or diffusion. A rapid thermal annealing (RTA) process may be used to activate the implanted dopants. The source and drain may have different doping profiles formed by multi-step implantation. Also, the source and drain may have different structures, such as raised, recessed, or strained. A channel may be formed between the source and the drain. The length of the channel, L, may be defined as the distance from the edge of the source to the interface between the N-well region and the P-well region.

The body contact feature 144 may be formed in the P-well region. Body contact feature 144 may be P-type doped with higher concentration of P-type impurity (such as boron) than that of the P-well region to provide a contact for connecting P-well region 120.

A gate 160 is formed over the substrate and interposed laterally between the source 142 and the drain 152. The active region 140 has a first outline and a second outline defining a width, Wa, of the active region. The gate 160 has a third outline and a fourth outline defining a width, Wg, less than or about equal to that of the active region 140, Wa and is disposed between the source 142 and the drain 152 and between the first and the second outlines of the active region. The source 142 is configured to have a width, Ws, less than or about equal to that of the gate 160, Wg and is disposed inside the active region 140 and between the third and the fourth outlines of the gate. The gate 160 formed over the substrate 110 has a configuration wherein the gate 160 and the source 142 are laterally disposed such that portions of their perimeters may be substantially aligned or coplanar. The gate 160 extends over the isolation region 186 between the active region 140 and the active region 150. The gate 160 is positioned to be within the first and the second outlines of the active region 140 such that the gate 160 does not extend beyond the source and the drain along the width dimension. Such configuration of the gate 160 ensures that no additional channel underlying the isolation structure is turned on while a high voltage is applied to the gate 160. In contrast, in a conventional MOS or high voltage MOS such as LDMOS, the width of the gate is wide and well extended beyond the active regions to form end caps overlying the trench isolation regions. The end caps of the gate may turn on the parasitic channel under the trench isolation and deviate from a desired current-voltage characteristic while a high voltage is applied to the gate.

The gate may be configured to extend from a source edge 148 of the source 142 to a region above isolation feature 186 as shown. The gate 160 may comprise a gate electrode 162 to be coupled to metal interconnects and a gate dielectric 164 interposed between the gate electrode and the substrate. The gate 160 may further include spacers 166 and 168 formed on both sides of the gate electrode 162 and the gate dielectric 164.

Figure 4:
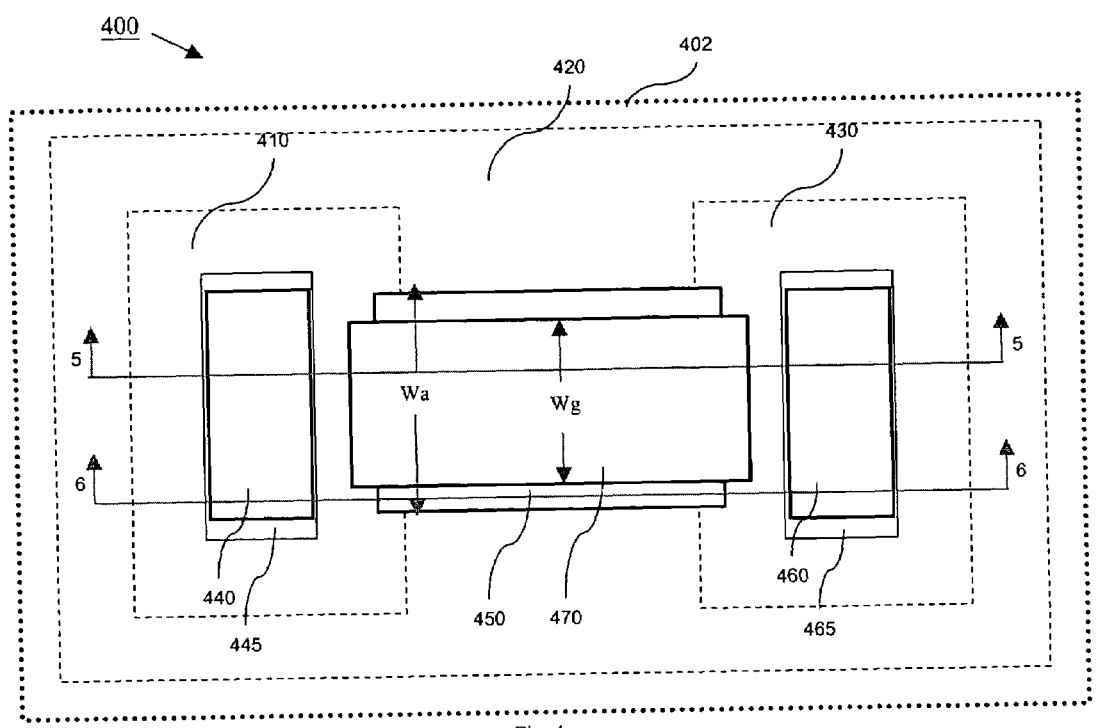
FIG. 4 is a plan view of another embodiment of a high voltage semiconductor device constructed according to aspects of the present disclosure.
Figure 5:
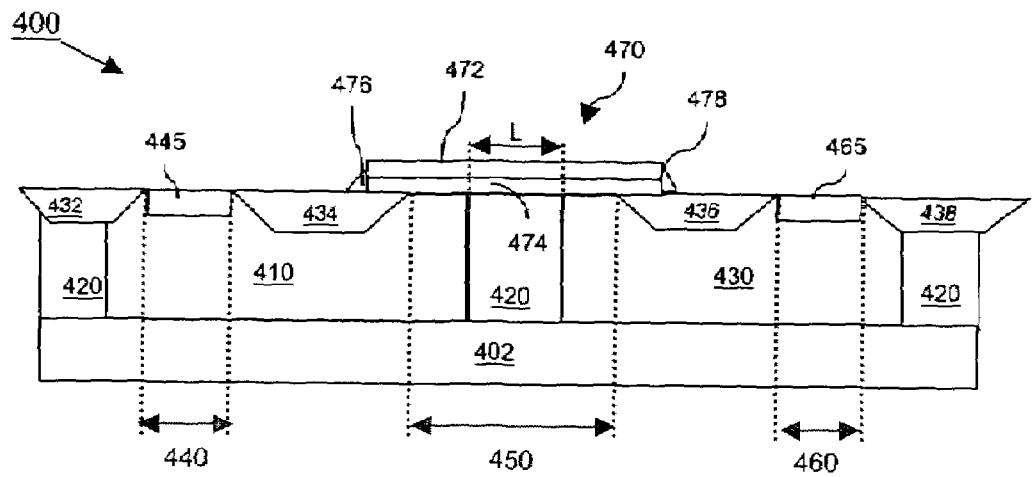
FIG. 5 is a cross-sectional view of the embodiment of the high voltage semiconductor device of FIG. 4 taken along line 5—5.
Figure 6:
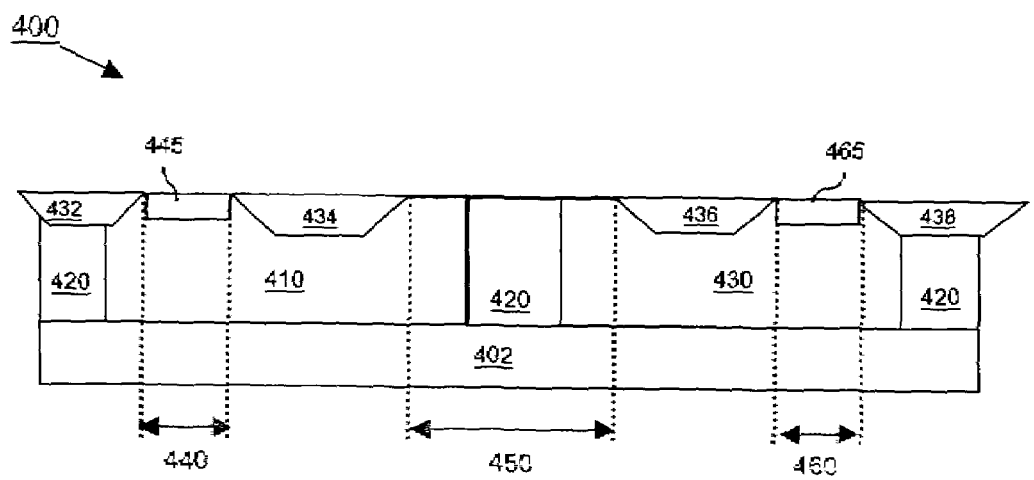
FIG. 6 is a cross-sectional view of the embodiment of the high voltage semiconductor device of FIG. 4 taken along line 6—6.

FIG. 4 is a plan view of another embodiment of a high voltage semiconductor device having a symmetric structure. FIG. 5 and FIG. 6 are cross-sectional views of the high voltage semiconductor device 400 of FIG. 4 taken along lines 5—5 and 6—6, respectively. The high voltage semiconductor device 400 may include a substrate 402. The substrate 402 may be substantially similar to the substrate 110 of the high voltage semiconductor device 100 and may comprise a buried layer such as a NBL, a PBL, and a BOX. Located in the substrate are an N-well region 410, a P-well region 420, and an N-well region 430 (also referred to as HVNW 410, HVPW 420, and HVNW 430), wherein the P-well region 420 is configured to laterally surround both N-well regions 410 and 430. The N-well region 410 and the N-well region 430 may be symmetrically disposed inside the P-well region 420. The P-well region 420 and the N-well regions 410 and 430 may be formed by an ion implantation process.

An isolation structure such as shallow trench isolation (STI) may be formed within the substrate to electrically isolate and define active regions 440, 450, and 460. The isolation structure may include features 432, 434, 436, and 438. The active region 440 may be disposed in the N-well region 410 and may include an N-doped region which functions as a source 445 wherein the source 445 may extend beyond the perimeter of the active region 440. The active region 460 may be disposed in the N-well region 430 and may include an N-doped region which functions as a drain 465 wherein the drain 465 may extend beyond the perimeter of the active region 460. The active region 450 may be interposed between the active regions 440 and 460. The active region 450 may be defined in the P-well region 420 between the active regions 440 and 460 and extend to the N-well regions 410 and 430, as shown in FIG. 4.

The source 445 and drain 465 may be doped with an N-type impurity such as phosphorous. The source 445 and drain 465 may be formed by ion implantation and/or diffusion. A rapid thermal annealing step may be used to activate the implanted dopants. The source and drain may have different doping profiles formed by multi-step implantation. Also, the source and drain may have different structures, such as raised, recessed, or strained. A channel may be formed between the source and the drain. The length of the channel, L, may be defined as the distance from the interface between the N-well region 410 and the P-well region 420 to the interface between the P-well region 420 and the N-well region 430.

A gate 470 is formed over the substrate and interposed between the source 445 and the drain 465. The active region 450 has a first outline and a second outline defining a width, Wa, of the active region 450. The gate 470 is configured to have a width, Wg, less than or about equal to that of the active region 450, Wa and is disposed between the active region 440 and the active region 460 and between the first and the second outlines of the active region 450. The gate 470 may extend over the isolation region 434 between the source 445 and the active region 450. The gate 470 may also extend over the isolation region 436 between the drain 465 and the active region 450. The gate 470 is positioned to be within the active region 450 laterally along the width dimension such that the gate is not extended beyond the active region 450. Such configuration of the gate ensures that no additional channel underlying the isolation structure is turned on while a high voltage is applied to the gate.

The gate 470 may comprise a gate electrode 472 to be coupled to metal interconnects and a gate dielectric 474 interposed between the gate electrode and the substrate. The gate 470 may further include spacers 476 and 478 formed on both sides of the gate electrode 472 and the gate dielectric 474.

It is understood that the high voltage semiconductor devices 100 and 400 are illustrated herein only as examples. The high voltage semiconductor device may not be limited to an NMOS device and can be extended to a PMOS having a narrow gate with similar structure and configuration except that all doping types may be reversed and dimensions are modified according to PMOS designs. The high voltage semiconductor devices 100 may be a lateral diffused MOS (LDMOS) formed in a dual-well structure (HVPW 120 and HVNW 130) within the substrate 110. The high voltage semiconductor devices 400 may be a LDMOS formed in a triple-well structure (N-well region 410, P-well region 420, and N-well region 430).

Further embodiments may also include, but are not limited to, vertical diffused metal-oxide-semiconductor (VDMOS), other types of high power MOS transistors, Fin structure fieled effect transistors (FinFET), and strained MOS structures.

The semiconductor substrate may comprise an elementary semiconductor such as silicon, germanium, and diamond. The substrate may also comprise a compound semiconductor such as silicon carbide, gallium arsenic, indium arsenide, and indium phosphide. The substrate may comprise an alloy semiconductor such as silicon germanium, silicon germanium carbide, gallium arsenic phosphide, and gallium indium phosphide. The substrate may include an epitaxial layer. For example, the substrate may have an epitaxial layer overlying a bulk semiconductor. Further, the substrate may be strained for performance enhancement. For example, the epitaxial layer may comprise a semiconductor material different from those of the bulk semiconductor such as a layer of silicon germanium overlying a bulk silicon, or a layer of silicon overlying a bulk silicon germanium formed by a process including SEG. Furthermore, the substrate may comprise a semiconductor-on-insulator (SOI) structure such as a buried dielectric layer. Alternatively, the substrate may comprise a buried N-type layer and a buried P-type layer.

In one embodiment, the buried dielectric layer may be a buried oxide (BOX) layer, such as that formed by a method referred to as separation by implantation of oxygen (SIMOX) technology, wafer bonding, selective epitaxial growth (SEG), or other proper method. Moreover, although not limited by the scope of the present disclosure, the buried dielectric layer may include silicon oxide, silicon nitride, silicon oxynitride, low k materials, air gap, combinations thereof, and/or other materials.

The semiconductor devices 100 and 400 may comprise an isolation feature to separate different devices formed on the substrate. The isolation feature may comprise different structure and can be formed using different processing technologies. For example, the isolation feature may comprise local oxidation of silicon (LOCOS), shallow trench isolation (STI), and/or other suitable isolation structures. LOCOS may include thermal oxidation using a patterned mask layer. STI may include etching a trench in a substrate and filling the trench by insulator materials such as silicon oxide, silicon nitride, or silicon oxynitride. The trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

Gate dielectric may include silicon oxide, silicon oxynitride, or a high k dielectric, such as hafnium oxide, hafnium silicide, hafnium silicon oxide, hafnium silicon oxynitride, zirconium oxide, aluminum oxide, a hafnium dioxide-alumina ($HfO_2$—$Al_2O_3$) alloy, silicon nitride, Tantalum pentoxide or combinations thereof. Gate dielectric may be formed by thermal oxide, ALD, CVD, or PVD. The gate dielectric may have multi-layer structure, such as first layer of Silicon oxide by thermal oxidation, and a second layer of high k material. The gate dielectric may include more processing during formation such as nitrogen treatment of thermal oxide layer, and/or annealing of the gate dielectric stack including both silicon oxide and a high k layer.

Gate electrode may be connected to an overlying interconnects structure through low resistant interfaces. The gate electrode may include conductive materials and may have multilayer structure. The gate electrode may be silicon-containing, germanium-containing, other conductive material, and combinations thereof. For example, the conductive material may include doped polycrystalline silicon (poly-Si), poly-SiGe, metal, metal silicide, metal nitride, metal oxide, carbon nanotube, or a combination thereof. The metal may include copper, tungsten, aluminum, aluminum alloy, palladium, titanium, tantalum, nickel, cobalt, and molybdenum. The metal silicide may include copper silicide, tungsten silicide, aluminum silicide, palladium silicide, titanium silicide, tantalum silicide, nickel silicide, cobalt silicide, erbium silicide, and molybdenum silicide. Gate electrode may be formed by CVD, PVD, silicidation, plating, and/or ALD. The gate electrode may include more process during formation such as implant doping for polysilicon, or annealing for silicidation. The gate electrode may have dual structure such as different height of gate for PMOS and NMOS, or/and different materials for NMOS and PMOS.

Spacers positioned on both sides of the gate may include a dielectric material such as silicon nitride, silicon oxide, silicon carbide, silicon oxynitride, or combinations thereof. Spacers may have a multilayer structure and be formed by depositing dielectric material and then dry-etching.

The high voltage semiconductor devices may further include a stress layer 190 overlying the substrate and gate features. The stress layer 190 may be deposited by conventional methods including CVD, PVD, ALD, and thermal oxidation. The stress layer 190 may comprise silicon nitride, silicon oxynitride, silicon oxide, and silicon carbide. The stress layer 190 may have multilayer structure and be conformal to the underlying features. The stress layer 190 may include a etch stop layer (ESL). The stress layer 190 may have a localized stress pattern. For example, the stress layer 190 may have a tensile stress in one region containing an N-type MOS region and a compressive stress in another region containing a P-type MOS region. The stress type and level of the stress layer 190 may be tuned using parameters including processing temperature, composition, and impurities.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a source active region and a drain active region disposed in a substrate and spaced from one another in a first dimension, the source active region having a first and a second outline defining a width of the source active region in a second dimension substantially perpendicular to the first dimension; and
   a gate having a third outline and a fourth outline defining a width of the gate not more than the width of the source active region and disposed between a source in the source active region and a drain in the drain active region and between the first and the second outline, wherein the source having a width not more than the width of the gate and disposed proximate the gate and between the third and the fourth outline.

2. The semiconductor device of claim 1 wherein the semiconductor device is a lateral diffused metal-oxide-semiconductor field effect transistor having a asymmetric structure.

3. The semiconductor device of claim 1 further comprising a first-type well and a second-type well formed in the substrate wherein the first-type well is doped with a first-type dopants, the second-type well is doped with a second-type dopants, and the second-type well is disposed surrounding the first-type well.

4. The semiconductor device of claim 3 wherein the semiconductor device has a dual-well structure formed in the substrate and the source is formed in the first-type well and the drain is formed in the second-type well.

5. The semiconductor device of claim 4 wherein the first-type well further comprises a doped region of the first-type dopants that functions as a body contact to the first-type well.

6. The semiconductor device of claim 3, further comprising an isolation feature formed in the second-type well adjacent the drain and laterally interposed between the source and the drain.

7. The semiconductor device of claim 6 wherein the isolation feature comprises a shallow trench isolation structure.

8. The semiconductor device of claim 7 wherein the gate is extended to partially overlay the isolation region.

9. The semiconductor device of claim 1 further comprising a stress layer overlying the substrate and the gate wherein the stress layer includes a material selected from the group consisting of silicon nitride, silicon oxynitride, silicon carbide, silicon oxide, and a combination thereof.

10. The semiconductor device of claim 1 further comprising a plurality of isolation structures wherein the isolation structures electrically isolate a plurality of the source and drain.

11. A semiconductor device comprising:
a source and a drain disposed in a substrate and spaced from one another in a first dimension;
an active region having at least a portion of the drain formed therein and having a first and a second outline defining a width of the active region in a second dimension substantially perpendicular to the first dimension; and
a gate partially overlying the active region and partially overlaying an isolation region, having a width in the second dimension not more than the width of the active region, disposed between the source and the drain and between the first and the second outline of the active region.

12. The semiconductor device of claim 11 wherein the semiconductor device comprises a lateral diffused metal-oxide-semiconductor field effect transistor.

13. The semiconductor device of claim 11 further comprising a plurality of isolation features wherein the isolation features electrically isolate a plurality of the source and drain.

14. The semiconductor device of claim 13 wherein the isolation features comprise a shallow trench isolation structure.

15. The semiconductor device of claim 11 further comprising a first-type well and a second-type well formed in the substrate wherein the first-type well is doped with a first-type dopants and the second-type well is doped with a second-type dopants.

16. The semiconductor device of claim 15 wherein the semiconductor device has a dual-well structure formed in the substrate and the source is formed in the first-type well and the drain is formed in the second-type well.

17. The semiconductor device of claim 16 wherein the isolation region is laterally contacting the drain and interposes between the source and the drain.

18. The semiconductor device of claim 17 wherein the first-type well further comprises a doped region of the first-type dopants that functions as a body contact to the first-type well.

19. The semiconductor device of claim 11 wherein the gate comprises a gate electrode and a gate dielectric.

20. The semiconductor device of claim 19 wherein the gate electrode comprises a material selected from the group consisting of doped polysilicon, metal, metal alloy, metal silicide, and a combination thereof.

21. The semiconductor device of claim 20 wherein the gate dielectric comprises a material selected from the group consisting of silicon oxide, silicon oxynitride, a high k material, and a combination thereof.

22. The semiconductor device of claim 11 further comprising a stress layer overlying the substrate and the gate wherein the stress layer includes a material selected from the group consisting of silicon nitride, silicon oxynitride, silicon carbide, silicon oxide, and a combination thereof.

23. A semiconductor circuit comprising:
at least one source and drain disposed in a substrate and spaced from one another in a first dimension;
at least one active region having at least a portion of the drain formed therein and having a first and a second outline defining a width of the active region in a second dimension substantially perpendicular to the first dimension;
at least one isolation region; and
at least one gate overlying a portion of the at least one active region and a portion of the at least one isolation region, having a width in the second dimension not more than the width of the active region, wherein the at least one gate is disposed between the at least one source and drain and between the first and the second outline, wherein a width of the source is not more than a width of the gate, and wherein the at least one source, drain, and gate form a high voltage transistor.

24. The semiconductor device of claim 23 further comprising isolation features beyond the first outline and the second outline of the active region.

25. The semiconductor device of claim 24 wherein the isolation features comprises shallow trench isolation (STI) structure.

26. The semiconductor device of claim 23 wherein the high voltage transistor comprises an N-channel metal-oxide-semiconductor (NMOS) transistor.

27. The semiconductor device of claim 23 wherein the high voltage transistor comprises a P-channel metal-oxide-semiconductor (PMOS) transistor.

* * * * *